United States Patent
Ono et al.

(10) Patent No.: US 9,438,116 B2
(45) Date of Patent: Sep. 6, 2016

(54) CONTROL UNIT FOR A BOOST CONVERTER DEVICE

(71) Applicant: TOYOTA JIDOSHA KABUSHIKI KAISHA, Toyota-shi, Aichi-ken (JP)

(72) Inventors: Toshikazu Ono, Toyota (JP); Daigo Nobe, Toyota (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/705,192

(22) Filed: May 6, 2015

(65) Prior Publication Data

US 2015/0326124 A1   Nov. 12, 2015

(30) Foreign Application Priority Data

May 9, 2014   (JP) ................................. 2014-097799

(51) Int. Cl.
*H02M 3/158*   (2006.01)
*G01R 31/00*   (2006.01)
*H02M 1/32*   (2007.01)
*H02M 1/00*   (2006.01)

(52) U.S. Cl.
CPC ............. *H02M 3/158* (2013.01); *G01R 31/00* (2013.01); *H02M 1/32* (2013.01); *H02M 2001/0009* (2013.01)

(58) Field of Classification Search
CPC ..................................................... H02M 3/158
See application file for complete search history.

(56) References Cited

U.S. PATENT DOCUMENTS

| | | | | |
|---|---|---|---|---|
| 8,581,533 B2* | 11/2013 | Hayashi | ................. | H02P 29/02 310/315 |
| 2014/0321182 A1* | 10/2014 | Takamatsu | ................ | B60L 7/14 363/132 |
| 2015/0191133 A1* | 7/2015 | Okamura | ............ | H02M 3/1588 307/9.1 |

FOREIGN PATENT DOCUMENTS

JP         2006-311635 A      11/2006

* cited by examiner

*Primary Examiner* — Emily P Pham
(74) *Attorney, Agent, or Firm* — Kenyon & Kenyon LLP

(57) ABSTRACT

A boost converter device includes a converter, a current sensor which detects a reactor current flowing through a reactor, and a control unit which controls the converter by using feedback control of the reactor current. The control unit executes at least one of reducing a carrier frequency which is used in the control of the converter and reducing a duty command value which is used in the control of the converter, detects an amplitude of current ripple by the current sensor during execution of the reduction of the carrier frequency or the reduction of the duty command value, and detects the current sensor as being abnormal in a case where the amplitude of the current ripple is less than a predetermined current fluctuation range at the time of abnormality of the current sensor.

4 Claims, 6 Drawing Sheets

CONTROL UNIT FOR A BOOST CONVERTER DEVICE

INFORMATION OF RELATED APPLICATION

This application claims priority to Japanese Patent Application No. 2014-97799, filed on May 9, 2014, the entire content of which is incorporated herein by reference.

TECHNICAL FIELD

The present invention relates to a boost converter device capable of boosting and outputting a voltage which is input from a battery.

BACKGROUND Art

In the related art, for example, in JP 2006-311635 A, there is described a boost converter control device. In this control device, a control signal for switching a switching element which is included in a boost converter is generated by feedback control of a boost voltage which is an output voltage of the boost converter and feedback control of a reactor current flowing through a reactor which is included in the boost converter.

SUMMARY OF THE INVENTION

In the boost converter control device described in JP 2006-311635 A, the reactor current is detected by a current sensor and input to the control device, and used in feedback control of the boost converter. For this reason, if abnormality occurs in the current sensor, thus creating a state where an output value fluctuates only in a narrow current width (a state of being fixed to a substantially constant value), it is not possible to properly feedback-control the reactor current, and as a result, the feedback control of the boost voltage is also affected, and thus a situation occurs in which it becomes impossible to converge the boost voltage to a boost voltage command value. From such a viewpoint, it is necessary to appropriately detect abnormality of the current sensor which detects the reactor current.

An object of the present invention is to appropriately detect abnormality of a current sensor which detects a reactor current, in a boost converter device which controls a boost voltage by using feedback control of the reactor current.

According to an aspect of the present invention, there is provided a boost converter device including: a boost converter which includes a reactor and a switching element and can boost and output a voltage which is input from a battery; a current sensor which detects a reactor current flowing through the reactor; and a control unit which controls the boost converter by using feedback control of the reactor current, wherein the control unit executes at least one of reducing a carrier frequency which is used in the control of the boost converter and reducing a duty command value which is used in the control of the boost converter, detects an amplitude of a current ripple by the current sensor when the reduction of the carrier frequency or the reduction of the duty command value is being executed, and detects the current sensor as being abnormal in a case where the amplitude of the current ripple falls below a predetermined current fluctuation range at the time of abnormality of the current sensor.

In the boost converter device according to the present invention, it may be the case that the reduction of the carrier frequency or the reduction of the duty command value is executed only in a period to detect the amplitude of the current ripple by the current sensor.

Further, in the boost converter device according to the present invention, it may be the case that detection of abnormality of the current sensor is performed only when a vehicle speed is greater than or equal to a predetermined value.

According to the boost converter device related to the present invention, abnormality detection is performed by executing at least one of reducing the carrier frequency which is used in the control of the boost converter and reducing the duty command value which is used in the control of the boost converter and detecting the amplitude of the current ripple of the reactor current by the current sensor. By doing so, the difference between amplitudes at the time of normality and the time of abnormality of the ripple of the reactor current at the time of the detection of the abnormality of the current sensor becomes significant, and therefore, it becomes possible to appropriately detect the abnormality of the current sensor.

BRIEF DESCRIPTION OF THE DRAWINGS

The present invention will be further described with reference to the accompanying drawings wherein like reference numerals refer to like parts in the several views, and wherein.

DESCRIPTION OF EMBODIMENTS

Figure 1:
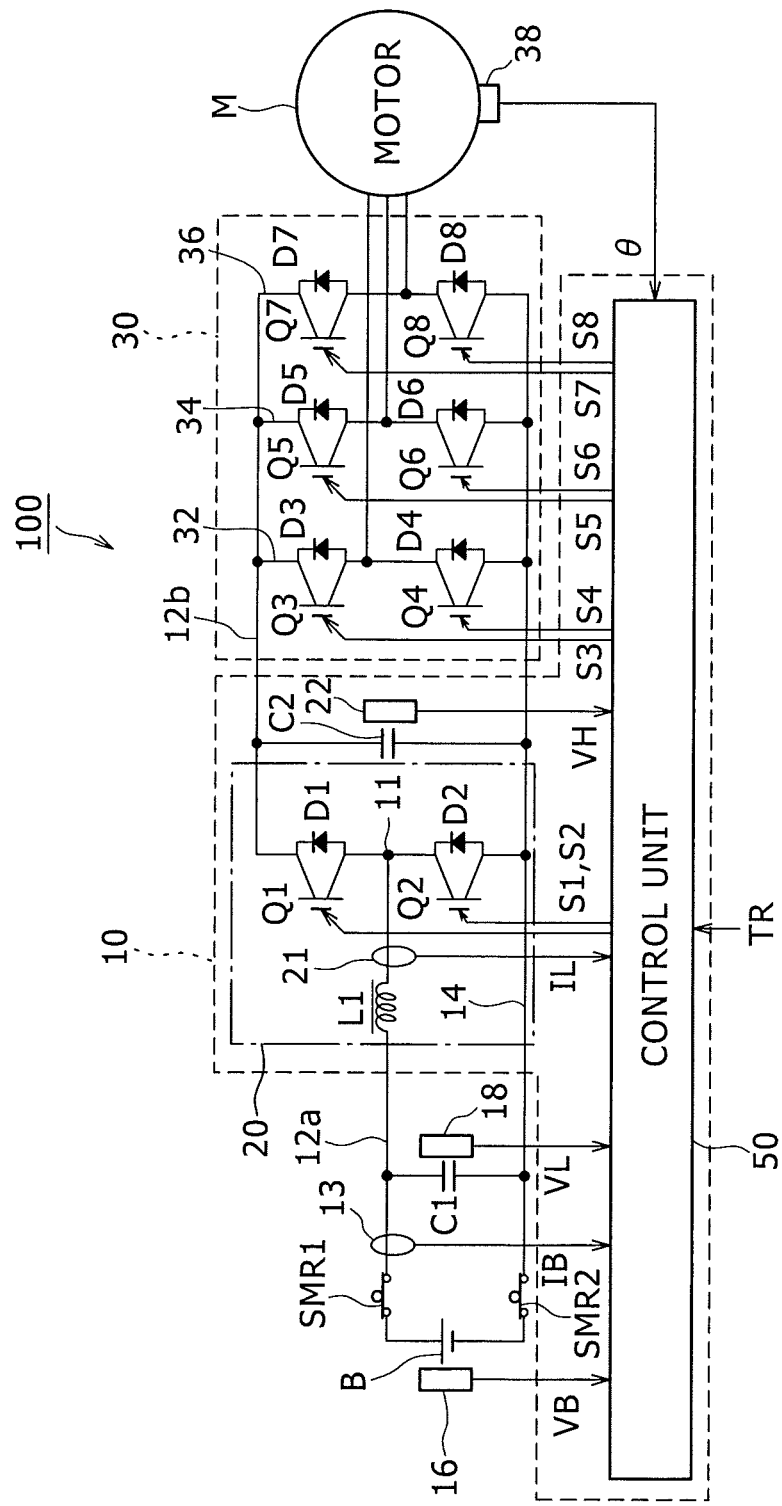
FIG. 1 is a diagram showing an overall schematic configuration of a motor driving device which includes a boost converter device according to an embodiment of the present invention.

Hereinafter, an embodiment related to the present invention will be described in detail with reference to the accompanying drawings. In the description, a specific shape, material, numerical value, direction, and the like are exemplifications for facilitating understanding of the present invention and can be appropriately changed in accordance with a use, a purpose, specifications, or the like. Further, in the following, in a case where a plurality of embodiments, a modified example, or the like are included, use of characterizing portions of these in appropriate combination is assumed from the beginning. FIG. 1 is a circuit diagram of a motor driving device 100 which includes a boost converter device 10 according to an embodiment of the present invention. As shown in FIG. 1, the motor driving device 100 is provided with a battery B which is a direct-current power supply, a converter (a boost converter) 20, an inverter 30, positive lines 12a and 12b, a negative line 14, current sensors 13 and 21, voltage sensors 16, 18, and 22, a filter capacitor C1, a smoothing capacitor C2, and a control unit 50. Among these, the boost converter device 10 according to this embodiment is configured to include the converter 20, the current sensor 21, and a portion of the control unit 50.

The motor driving device 100 is installed in an electric vehicle such as a hybrid automobile or an electric automobile (including a fuel-cell automobile). Then, a motor M mounted on a vehicle is mechanically connected to drive wheels (not shown) and generates torque for driving the vehicle. Alternatively, the motor M may be incorporated into a hybrid automobile as an electric motor which is mechanically connected to an engine (not shown), thereby operating as an electric generator which generates electric power by using the power of the engine, and performing the start-up of the engine.

The battery B is a rechargeable power storage device, and for example, a secondary battery such as a nickel-hydrogen battery or a lithium-ion battery is preferably used. However, instead of or in addition to the battery B, a large-capacity capacitor may be used as a power storage device.

The positive line 12a is connected to a positive terminal of the battery B and the negative line 14 is connected to a negative terminal of the battery B. Then, a system main relay SMR1 is provided in the positive line 12a and a system main relay SMR2 is provided in the negative line 14. Each of the relays SMR1 and SMR2 is on/off-controlled in response to a signal from the control unit 50.

The voltage sensor 16 is a sensor which detects the voltage between the terminals of the battery B. A battery voltage VB detected by the voltage sensor 16 is output to the control unit 50. In the following, the voltage sensor 16 is appropriately referred to as a VB sensor.

The current sensor 13 is provided in the positive line 12a which is connected to the positive terminal of the battery B. The current sensor 13 is a sensor which detects a current coming in and out of the battery B. A battery current IB detected by the current sensor 13 is output to the control unit 50. In the following, the current sensor 13 is appropriately referred to as an IB sensor.

The converter 20 includes a reactor L1, switching elements Q1 and Q2, and diodes D1 and D2. An end on one side of the reactor L1 is connected to the positive line 12a which is connected to the positive terminal of the battery B, and an end on the other side is connected to a connection point 11 of the switching element Q1 with the switching element Q2. The switching elements Q1 and Q2 are connected in series between the positive line 12b and the negative line 14. Then, the diodes D1 and D2 are respectively connected to the switching elements Q1 and Q2 in anti-parallel.

The converter 20 is a voltage conversion device which can boost the voltage between the positive line 12b and the negative line 14 to a voltage greater than or equal to the battery voltage VB based on a signal from the control unit 50. In a signal of the converter 20, a gate signal S1 for controlling ON-duty of the switching element Q1 and a gate signal S2 for controlling ON-duty of the switching element Q2 are included. At the time of a boost operation of the converter 20, the gate signals S1 and S2 are correlated with each other such that the switching elements Q1 and Q2 enter states opposite to each other (that is, when the switching element Q1 is ON, the switching element Q2 is OFF, and when the switching element Q1 is OFF, the switching element Q2 is ON).

The current sensor 21 detects a reactor current IL flowing through the reactor L1 of the converter 20 and outputs the detection value to the control unit 50. The current sensor 21 detects a current flowing from the battery B to the reactor L1 as a positive value and detects a current flowing from the reactor L1 to the battery B as a negative value. In the following, the current sensor 21 is appropriately referred to as an IL sensor. The filter capacitor C1 is connected between the positive line 12a and the negative line 14. The voltage sensor 18 detects a voltage VL between the two ends of the filter capacitor C1 as an input voltage of the converter 20 and outputs the detection value to the control unit 50. In the following, the voltage sensor 18 is appropriately referred to as a VL sensor.

The smoothing capacitor C2 is connected between the positive line 12b and the negative line 14. The smoothing capacitor C2 smoothes a direct-current voltage from the converter and supplies the smoothed direct-current voltage to the inverter 30. The voltage sensor 22 detects a voltage VH between the two ends of the smoothing capacitor C2 as an output voltage of the converter 20 and outputs the detection value to the control unit. In the following, the voltage sensor 22 is appropriately referred to as a VH sensor.

The inverter 30 includes a U-phase arm 32, a V-phase arm 34, and a W-phase arm 36. The U-phase arm 32, the V-phase arm 34, and the W-phase arm 36 are connected in parallel between the positive line 12b and the negative line 14. The phase arms 32, 34, and 36 respectively include two series-connected switching elements Q3 and Q4, two series-connected switching elements Q5 and Q6, and two series-connected switching elements Q7 and Q8. Diodes D3 to D8 are respectively connected to the switching elements Q3 to Q8 in anti-parallel. Then, an intermediate point of each of the phase arms 32, 34, and 36 is connected to each of phase coils of the motor M.

The inverter 30 converts direct-current power which is supplied from the positive line 12b and the negative line 14 to a three-phase alternating current based on signals S3 to S8 from the control unit 50 and outputs the three-phase alternating current to the motor M, thereby driving the motor M. In this way, the motor M is driven so as to generate torque specified by a torque command value TR. Further, at the time of regenerative braking of an electric vehicle equipped with the motor driving device 100, the inverter 30 converts three-phase alternating-current power generated by the motor M to direct-current power based on a signal from the control unit 50 and outputs the direct-current power to the positive line 12b and the negative line 14 on the converter 20 side. In this case, the converter 20 steps down the direct-current power which is supplied from the inverter 30 to a voltage which can be charged in the battery B, and then outputs the step-down direct-current power to the battery B side. Therefore, the converter 20 is also called a boost/step-down converter.

A rotation angle sensor 38 is provided at the motor M. The rotation angle sensor 38 detects a rotor position of the motor M and outputs a detection value θ to the control unit 50. The control unit 50 can use the detection value θ in coordinate transformation or the like for generating a control signal of the inverter 30. Further, the control unit 50 can derive a motor rotation speed MRN or a vehicle speed based on the detection value θ.

The control unit 50 is configured with an electronic control unit (ECU) having a central processing unit (CPU) (not shown) and a memory (not shown) which are built in. The control unit 50 is configured so as to execute predetermined arithmetic processing based on a map and a program stored in the memory, and perform the state management of the battery B or the control of the converter 20 and the inverter 30. Alternatively, at least a portion of the ECU may be configured so as to execute predetermined numerical or logical arithmetic processing by means of hardware such as an electronic circuit.

The control unit 50 generates a PWM signal for driving the converter 20 by using a pulse width modulation method and outputs the generated PWM signal to the converter 20 as the signals S1 and S2. Further, the control unit 50 generates a PWM signal for driving the motor M, based on the torque command value TR of the motor M which is received from an external ECU (not shown) and the motor rotation speed MRN which is derived from the detection value θ of the rotation angle sensor 38, and outputs the generated PWM signal to the inverter 30 as the signals S3 to S8.

In addition, in this embodiment, the state management of the battery B and the control of the converter 20 and the inverter 30 are described as being performed by a single control unit 50. However, it is not limited thereto. For example, there may be employed a configuration such that the state management of the battery B, the boost operation of the converter 20, and the direct-current/alternating-current conversion operation of the inverter 30 are respectively managed or controlled by separate electronic control units (ECUs).

Figure 2:
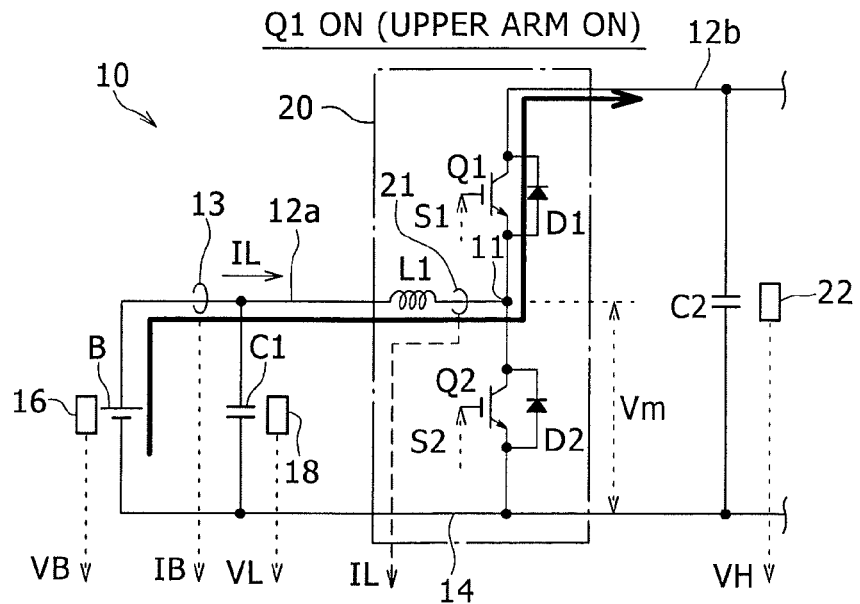
FIG. 2 is a diagram showing the flow of a current when a switching element of an upper arm of a converter is in an ON state.

FIG. 2 shows the flow of a (positive) current IL when the switching element Q1 of the converter 20 is in an ON state; that is, at the time of ON of an upper arm. In this case, as shown in FIG. 2, the current IL flows through the diode D1. If the voltage between the connection point 11 of the switching element Q1 with the switching element Q2 and the negative line 14 is set to be Vm, an inductance value of the reactor L1 is set to be L, and a slope (a rate of change per unit time) of the current IL is set to be dIL/dt, a voltage equation in this state becomes the following Expression (1).

$$VL - L(dIL/dt) - Vm = 0 \quad (1)$$

If the voltage between the two ends of the smoothing capacitor C2 is set to be VH, while the current IL is flowing through the diode D1, the voltage Vm becomes equal to VH, and therefore, if Expression (1) is modified by substituting VH for Vm in Expression (1), the following Expression (2) is obtained, and if Expression (2) is further modified, Expression (3) is obtained.

$$VL - L(dIL/dt) - VH = 0 \quad (2)$$

$$dIL/dt = (VL - VH)/L \quad (3)$$

From Expression (3), it is found that in a case where the current IL is positive, at the time of ON of the switching element Q1, the slope dIL/dt of the current IL becomes (VL−VH)/L. Usually, since VL is less than VH, the slope dIL/dt of the current IL is negative.

Figure 3:
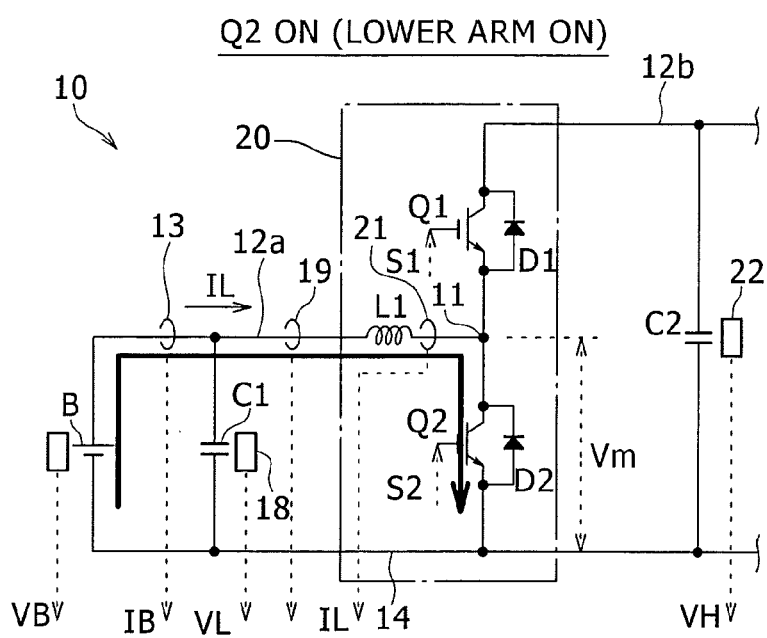
FIG. 3 is a diagram showing the flow of a current when a switching element of a lower arm of the converter is in an ON state.

FIG. 3 shows the flow of the (positive) current IL when the switching element Q2 of the converter 20 is in an ON state; that is, at the time of ON of a lower arm. In this case, as shown in FIG. 3, the current IL flows through the switching element Q2. A voltage equation in this state becomes the following Expression (4).

$$VL - L(dIL/dt) - Vm = 0 \quad (4)$$

Expression (4) itself is the same as Expression (1) described above. However, while the current IL is flowing through the switching element Q2, the voltage Vm is not VH but 0, and therefore, if Expression (4) is modified by substituting 0 for Vm in Expression (4), the following Expression (5) is obtained, and if Expression (5) is further modified, Expression (6) is obtained.

$$VL - L(dIL/dt) - 0 = 0 \quad (5)$$

$$dIL/dt = VL/L \quad (6)$$

From Expression (6), it is found that in a case where the current IL is positive, at the time of ON of the switching element Q2, the slope dIL/dt of the current IL becomes VL/L. Usually, since VL is greater than 0, the slope dIL/dt of the current IL is positive.

In this manner, in a case where the current IL is positive, the current IL at the time of ON of the switching element Q1 decreases with the slope (VL−VH)/L and the slope dIL/dt of the current IL at the time of ON of the switching element Q2 increases with VL/L. Therefore, at the time of the boost operation by the converter 20, a ripple is generated in which the reactor current IL repeats increase and decrease due to the switching operations of the switching elements Q1 and Q2 (refer to FIG. 5).

Figure 4:
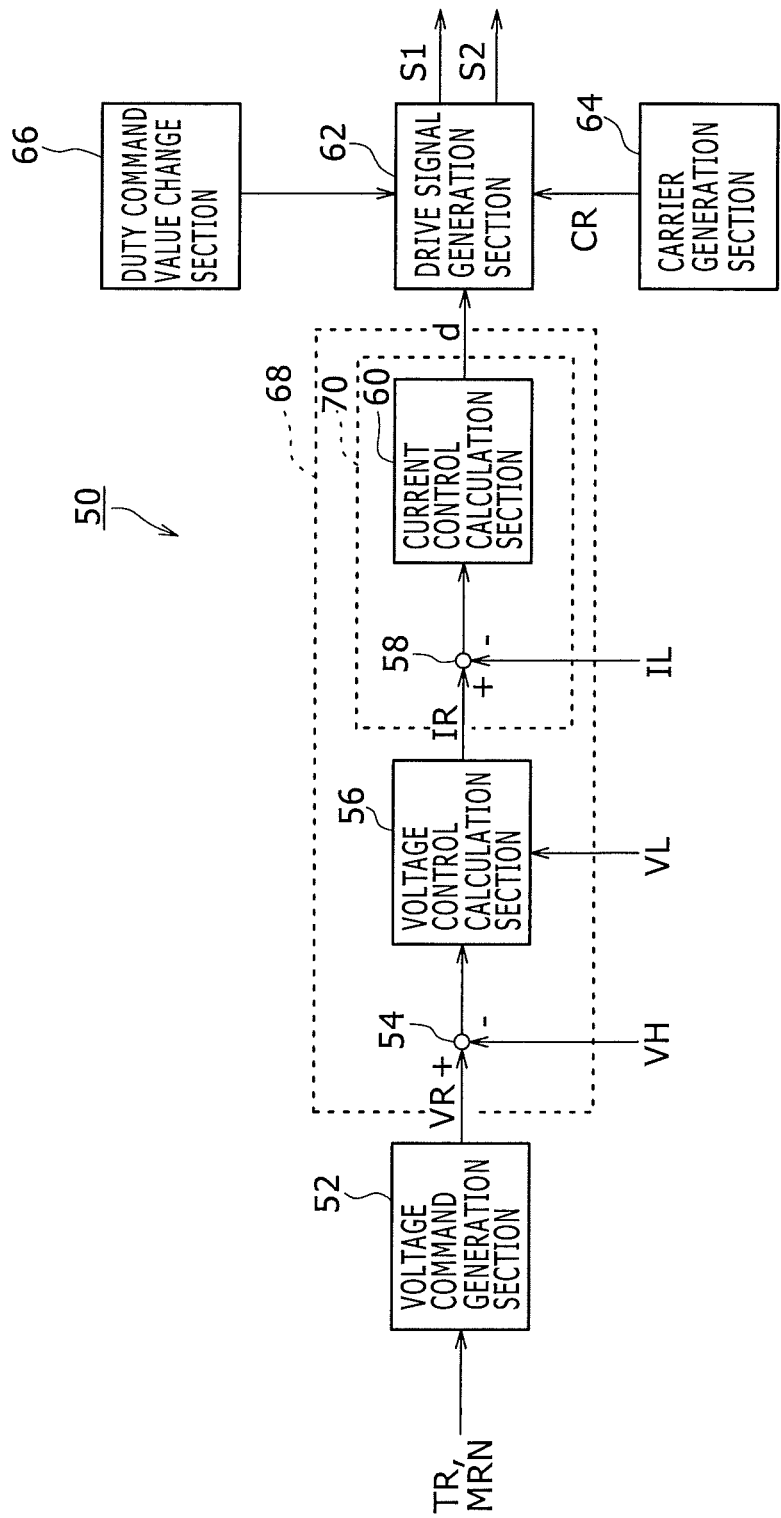
FIG. 4 is a functional block diagram of a portion related to converter control in a control unit of the boost converter device.

Next, the control of the boost operation in the converter 20 will be described with reference to FIG. 4. FIG. 4 is a functional block diagram of a portion related to the control of the converter 20, of the control unit 50. As shown in FIG. 4, the control unit 50 includes a voltage command generation section 52, subtraction sections 54 and 58, a voltage control calculation section 56, a current control calculation section 60, a drive signal generation section 62, a carrier generation section 64, and a duty command value change section 66.

The voltage command generation section 52 generates a voltage command value VR indicating a target value of the voltage VH which is the output voltage of the converter 20. For example, the voltage command generation section 52 generates the voltage command value VR based on the demand power of the motor M which is calculated from the torque command value TR of the motor M and the motor rotation speed MRN.

The subtraction section 54 subtracts the detection value of the voltage VH input from the VH sensor 22 from the voltage command value VR and outputs the calculation result to the voltage control calculation section 56.

The voltage control calculation section 56 executes feedback control (for example, proportional-integral control) for conforming the voltage VH to the voltage command value VR, by using the detection value of the voltage VL and a value obtained by subtracting the detection value of the voltage VH from the voltage command value VR. Then, the voltage control calculation section 56 outputs a calculated control amount as a current command value IR.

The subtraction section 58 subtracts the detection value of the current IL from the current command value IR which is output from the voltage control calculation section 56 and outputs the calculation result to the current control calculation section 60.

The current control calculation section 60 receives a value obtained by subtracting the detection value of the current IL by the IL sensor 21 from the current command value IR from the subtraction section 58 and executes feedback control (for example, proportional-integral control) for conforming the current IL to the current command value IR. Then, the current control calculation section 60 outputs a calculated control amount to the drive signal generation section 62 as a duty command value d.

The carrier generation section 64 generates a carrier signal CR composed of a triangle wave, for generating the PWM signals S1 and S2 in the drive signal generation section 62 (described later), and outputs the generated carrier signal CR to the drive signal generation section 62. Further, the carrier generation section 64 has a function to temporarily change a frequency fcr of the carrier signal CR when processing for abnormality detection of the IL sensor 21 is executed in the control unit 50 and a predetermined condition is satisfied. The details thereof will be described later.

The drive signal generation section 62 compares the duty command value d which is received from the current control calculation section 60 with the carrier signal CR which is received from the carrier generation section 64, in terms of magnitude, and generates the gate signals S1 and S2 according to the comparison result. For example, the drive signal generation section 62 makes the gate signal S1 ON (and makes the gate signal S2 OFF) in a case where the carrier signal CR is smaller than the duty command value d, and makes the gate signal S2 ON (and makes the gate signal S1 OFF) if this is not the case.

The duty command value change section 66 has a function to temporarily change the duty command value d when the processing for the abnormality detection of the IL sensor 21 is executed in the control unit 50 and a predetermined condition is satisfied. The details thereof will be described later.

In the control unit 50 having the above configuration, the feedback control for conforming the voltage VH to the voltage command value VR is executed by the voltage control calculation section 56 (voltage control). Then, the feedback control for conforming the current IL to the current command value IR is executed by the current control calculation section 60 with the control output of the voltage control calculation section 56 as the current command value IR of the current IL (current control). In this manner, the feedback controls for the voltage VH and the current IL are executed, whereby there can be suppressed fluctuation in the voltage VH due to dead time or the like which is set between ON times of the switching elements Q1 and Q2.

In addition, the subtraction section 54, the voltage control calculation section 56, the subtraction section 58, and the current control calculation section 60 form a main loop 68 for conforming the voltage VH to the voltage command value VR, and the subtraction section 58 and the current control calculation section 60 form a minor loop 70 for conforming the current IL to the current command value IR.

In order for the boost converter device 10 which includes the converter 20, the IL sensor 21, and the control unit 50 to operate normally, it is necessary for the VH sensor 22, the VL sensor 18, and the IL sensor 21 to function normally. Here, assuming a case where abnormality such as a detection value fluctuating only in a narrow current width occurs in the IL sensor 21, it is not possible to properly feedback-control the reactor current IL, and as a result, the feedback control of the output voltage VH after boost is also affected, and thus a situation occurs in which it becomes impossible to converge the output voltage VH to a boost voltage command value. From such a viewpoint, it is necessary to appropriately detect abnormality of the IL sensor 21 which detects the reactor current IL. Therefore, in the boost converter device 10 of this embodiment, sensor abnormality is appropriately detected by performing processing of detecting the abnormality of the IL sensor 21 as described later. In the following, the processing of detecting the abnormality of the IL sensor 21 which is executed in the control unit 50 will be described.

Figure 5:
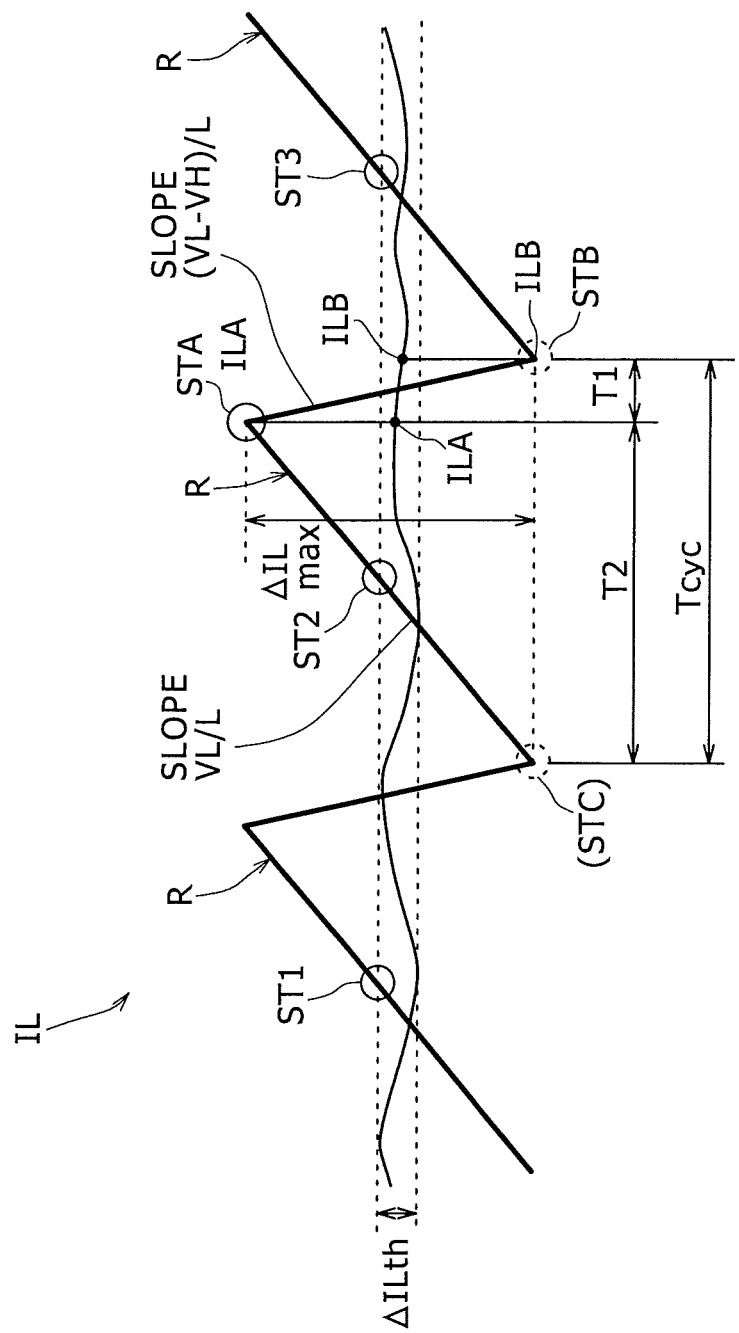
FIG. 5 is a diagram showing, by a thick solid line, a waveform of a reactor current which is detected by a current sensor at the time of normality, and by a thin solid line, that at the time of abnormality.

FIG. 5 is a diagram for describing the processing of detecting the abnormality of the IL sensor 21. In FIG. 5, the waveform of the reactor current IL which is detected by the IL sensor 21 is shown by a thick solid line at the time of normality and by a thin solid line at the time of abnormality.

At the time of the normality of the IL sensor 21, the reactor current IL shows a substantially sawtooth-like waveform in which triangular ripples R are continuous due to the switching operations of the switching elements Q1 and Q2 of the converter 20. Here, focusing on one ripple R, a period T2 in which the reactor current IL increases corresponds to an ON period of the switching element Q2 and the slope dIL/dt thereof becomes VL/L, as shown in Expression (6) described above. On the other hand, in the current ripple R, a period T1 in which the reactor current IL decreases corresponds to an ON period of the switching element Q1 and the slope dIL/dt thereof becomes (VL−VH)/L, as shown in Expression (3) described above. Then, the sum of the periods T1 and T2 is equivalent to one control period Tcyc, and the duty command value d can be represented by the following Expression (7) as the ratio of the ON period T1 of the switching element Q1 to one control period Tcyc.

$$d=T1/Tcyc(=VL/VH) \qquad (7)$$

Since the frequency fcr of the carrier signal CR which is output from the carrier generation section 64 in the control unit 50 is a known value stored previously, one control period Tcyc of one ripple R of the reactor current IL can be represented by 1/fcr. Further, the duty command value d which is output from the current control calculation section 60 in the control unit 50 is also a known value. Therefore, the ON period T1 of the switching element Q1 and the ON period T2 of the switching element Q2 can be calculated by the following Expressions (8) and (9).

$$T1=d \cdot Tcyc=d/fcr \qquad (8)$$

$$T2=Tcyc-T1 \qquad (9)$$

Usually, the sampling of the reactor current IL by the IL sensor 21 is performed for each control period Tcyc. In FIG. 5, with respect to the three ripples R, normal sampling timings ST1, ST2, and ST3 are indicated by O marks. In this manner, in a case where the reactor current IL is sampled for each control period, the detection values IL by the IL sensor 21 which normally operates become substantially the same value.

In contrast, at the time of the processing of detecting the abnormality of the IL sensor 21, with respect to the ripple R which forms a triangular shape in the waveform of the reactor current IL, a detection value ILA of the IL sensor 21 is obtained at a sampling timing STA corresponding to an apex portion and a detection value ILB of the IL sensor 21 is obtained at a sampling timing STB corresponding to a bottom portion. The sampling timings STA and STB can be set by the ON times T1 and T2 which are obtained by Expressions (8) and (9) described above. Then, by calculating a difference by subtracting the detection value ILB from the detection value ILA, it is possible to obtain a maximum current fluctuation range ΔILmax of the ripple R; that is, the amplitude of the ripple R. Here, the "apex portion" is intended to include a turn-around point on the upper side of the triangular ripple R and a high current portion in the vicinity thereof, and the "bottom portion" is intended to include a turn-around point on the lower side of the triangular ripple R and a low current portion in the vicinity thereof.

In addition, the sampling timings STA and STB of the reactor current IL at the time of the processing of detecting the abnormality of the IL sensor 21 may be added to the normal sampling timing ST2. Alternatively, the reactor current IL may be obtained at the sampling timings STA and STB instead of the normal sampling timing ST2 only in a period at the time of the abnormality detection processing. Further, as shown in FIG. 5, the reactor current IL may be sampled at a sampling timing STC in which current increase of the ripple R begins, in addition to (or instead of) the sampling timing STB. In this case, the current value ILB of the bottom portion of the ripple R may be determined by averaging detection values at the two sampling timings STB and STC.

As described above, by calculating the maximum current fluctuation range ΔILmax with respect to the ripple R of the reactor current IL and monitoring this, it is possible to appropriately detect the abnormality of the IL sensor 21. For example, in the IL sensor 21, there sometimes occurs abnormality in which there is created a state where a detection value is fixed to a substantially constant value. In the following, this abnormality is referred to as "fixation failure." In this case, the detection value of the IL sensor 21 fluctuates only in a predetermined narrow current fluctuation range ΔILth, as shown in FIG. 5. The current fluctuation range ΔILth is a specific value according to the type or the like of the IL sensor 21 and is previously stored in the memory of the control unit 50.

If the maximum current fluctuation range ΔILmax of the reactor current IL which is obtained as described above is greater than the current fluctuation range ΔILth, there can be made a determination that the fixation failure has not occurred in the IL sensor 21. However, there is a case where the maximum current fluctuation range ΔILmax of the ripple R of the reactor current IL is smaller than the current fluctuation range ΔILth, and in this case, there is a possibility that the fixation failure of the IL sensor 21 may be unable to be appropriately detected.

Therefore, in the boost converter device 10 of this embodiment, the fixation failure of the IL sensor 21 is detected by temporarily increasing a fluctuation range of the ripple R and then performing the sampling of the reactor current IL, as described below.

Figure 6:
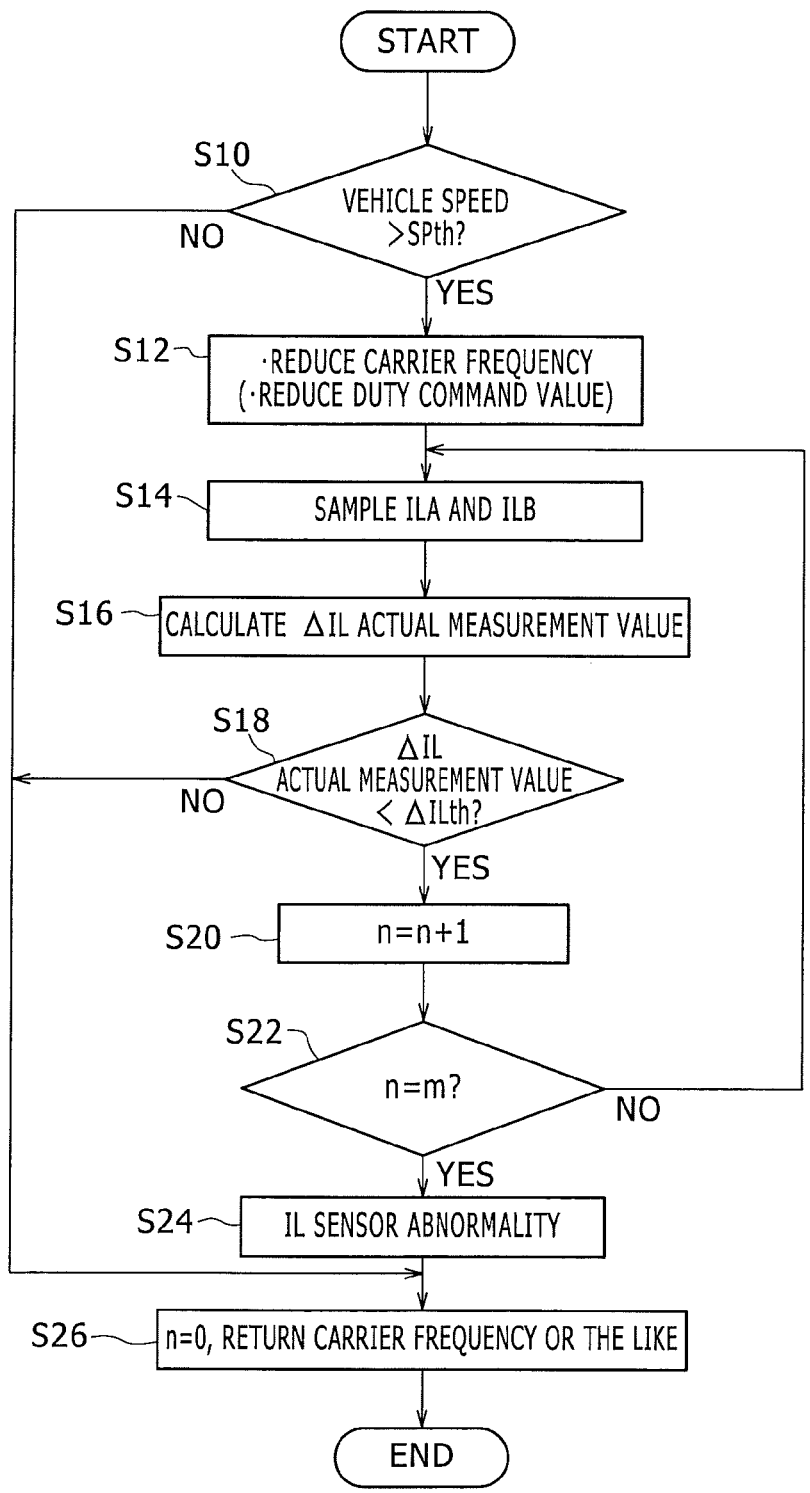
FIG. 6 is a flowchart showing a processing procedure for detecting abnormality of the current sensor, which is executed in the control unit.

FIG. 6 is a flowchart showing a processing procedure for detecting the fixation failure of the IL sensor 21, which is executed in the control unit 50 of this embodiment. This processing is executed at every predetermined time in the CPU of the control unit 50.

The control unit 50 first determines, in step S10, whether or not a vehicle speed of an electric vehicle equipped with the motor driving device 100 is higher than a predetermined speed SPth.

In this manner, executing the processing of detecting the abnormality of the IL sensor 21 in a case where the vehicle speed is greater than the predetermined speed SPth is for suppressing the influence on drivability by executing the processing in a vehicle speed range to the extent that noise and vibration of the converter 20 are not worrisome due to running sound (for example, engine sound, road noise, or the like), because if a carrier frequency which is used in the control of the converter 20 is reduced, there is a possibility that noise or vibration may increase. If an affirmative determination is made in the above step S10, the routine proceeds to the next step S12, and if not, the routine proceeds to step S26.

In a case where an affirmative determination is made in step S10, in subsequent step S12 the control unit 50 reduces the carrier frequency fcr from f1 to f2. This processing is executed by the carrier generation section 64 (refer to FIG. 4). Here, f1 is a carrier frequency which has been used in the boost control of the converter 20 before an operation of detecting the fixation failure of the IL sensor 21 is performed, and f2 is a carrier frequency for fixation failure detection which is lower than f1.

Figure 7:
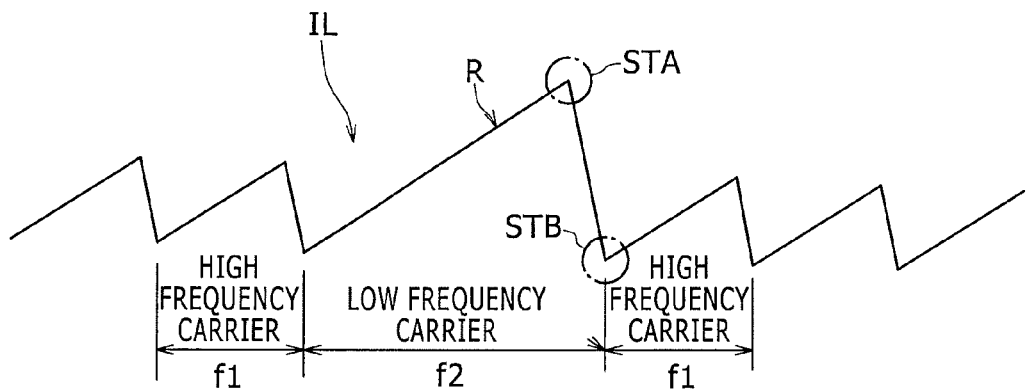
FIG. 7 is a diagram showing the waveform of the reactor current in a case where a carrier frequency is reduced for current sensor abnormality detection.

The carrier frequency fcr which is used in the control of the converter 20 is reduced in this manner, whereby control periods of the switching elements Q1 and Q2 become longer, as shown in FIG. 7, and therefore, the ripple R of the reactor current IL becomes larger. In this state, in subsequent step S14, the detection values ILA and ILB detected by the IL sensor 21 are sampled at the sampling timings STA and STB, as described with reference to FIG. 5. Then, in subsequent step S16, the control unit 50 calculates an actual measurement value of a current fluctuation range ΔIL (hereinafter referred to as a "ΔIL actual measurement value") by subtracting the detection value ILB from the detection value ILA.

Next, in subsequent step S18, the control unit 50 determines whether or not the ΔIL actual measurement value is smaller than the current fluctuation range ΔILth at the time of the fixation failure of the IL sensor 21. Here, referring to FIG. 5, in a case where the IL sensor 21 has been subjected to fixation failure, the detection values ILA and ILB which are detected by the IL sensor 21 are detected as values on a waveform which fluctuates only in a narrow range in the current fluctuation range ΔILth at the time of the fixation failure. Therefore, in a case where the ΔIL actual measurement value which is the difference between the detection values ILA and ILB is smaller or narrower than the current fluctuation range at the time of the fixation failure, the IL sensor 21 can be regarded as having been subjected to fixation failure.

In the above step S18, in a case where the ΔIL actual measurement value is not smaller than the current fluctuation range ΔILth at the time of the fixation failure (in step S18, NO), the sensor fixation failure detection processing is ended by way of the processing of step S26. In contrast, in a case where it is determined that the ΔIL actual measurement value is smaller than the current fluctuation range ΔILth at the time of the fixation failure, in subsequent step S20, n (the initial value: 0) is incremented to be n+1, and in subsequent step S22, whether or not n has become a predetermined value m (an integer of 2 or more) is determined. Then, the processing from the above step S14 to step S20 is repeatedly executed until a determination that n is equal to m is made. The degree of accuracy of the fixation failure detection is improved by determining the fixation failure of the IL sensor 21 repeatedly multiple times in this manner.

In a case where a determination that n is equal to m is made in step S22; that is, in a case where a state where the ΔIL actual measurement value is smaller than the current fluctuation range ΔILth at the time of the fixation failure is detected continuously multiple times, in subsequent step S24, the IL sensor 21 is detected as being a fixation failure. In this manner, in a case where the fixation failure of the IL sensor 21 is determined, the control unit 50 can transition to a fail-safe mode. As the fail-safe mode, for example, instead of the detection value of the IL sensor 21, the battery current IB which is detected by the IB sensor 13 can be used in the current feedback control of the converter 20. Further, it is preferable that the control unit 50 informs a driver of the fixation failure of the IL sensor 21 by lamp display, sound, or the like.

Then, in subsequent step S26, the control unit 50 resets n to 0 and returns the carrier frequency fcr from f2 to f1 (refer to FIG. 7). In this way, the processing of detecting the fixation failure of the IL sensor is ended.

As described above, according to the boost converter device 10 of this embodiment, when detecting the fixation failure of the IL sensor 21, the fixation failure of the IL sensor 21 is determined by temporarily increasing the ripple R of the reactor current IL and then sampling the apex portion which is the high current portion of the ripple R and the bottom portion which is the low current portion of the ripple R by the IL sensor. In this way, with respect to the ripple R of the reactor current IL, the difference between current fluctuations at the time of the normality and the time of the fixation failure becomes significant, and thus it becomes possible to appropriately detect the fixation failure of the IL sensor 21.

Further, according to the boost converter device 10 of this embodiment, the carrier frequency is changed only in a period to sample, for example, the two current values ILA and ILB for the fixation failure detection processing, and therefore, the influence on drivability can be reduced by making the sampling period as short as possible.

In addition, according to the boost converter device 10 of this embodiment, the processing of detecting the fixation failure of the IL sensor 21 is executed when the vehicle speed is greater than or equal to a predetermined value, and therefore, even if noise and vibration occur in the converter 20 due to a reduction in the carrier frequency fcr, there is created a running state where a driver or the like does not mind the noise and the vibration, and therefore, it is possible to reduce the influence on drivability.

It is to be noted that the boost converter device according to the present invention is not limited to the above-described embodiment and a modified example thereof, and various changes or improvements can be made within the matters set forth in the appended claims of this application and an equivalent range thereof.

Figure 8:
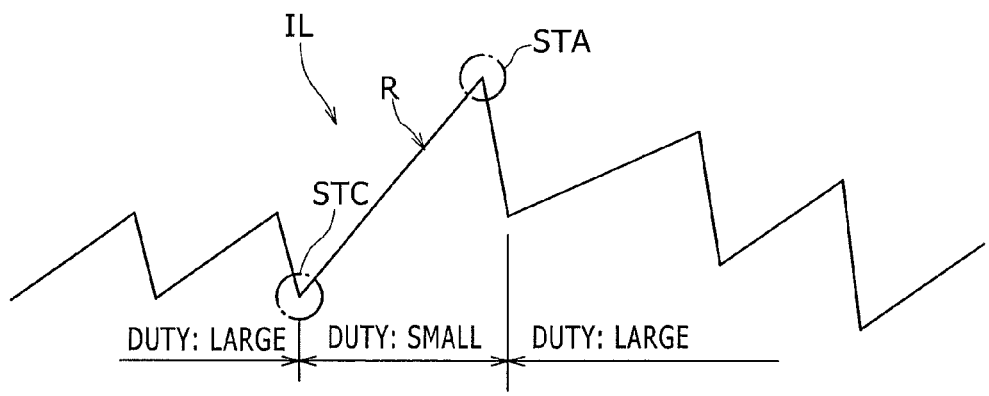
FIG. 8 is a diagram showing the waveform of the reactor current in a case where a duty command value is reduced for current sensor abnormality detection.

For example, in the above, the ripple R of the reactor current IL has been described as being increased by reducing the carrier frequency fcr. However, the invention is not limited thereto, and as shown in parentheses in step S12 of FIG. 6, the ripple R of the reactor current IL may be increased by temporarily reducing the duty command value d by means of the duty command value change section 66. A duty ratio is reduced in this way, whereby the boost voltage by the converter 20 is temporarily increased, as shown in FIG. 8, and thus a state is created where the amplitude of the ripple R of the reactor current IL is also large. In this state, it is possible to perform the detection of the fixation failure of the IL sensor 21 by detecting the current value ILA at the sampling timing STA corresponding to the apex portion of the ripple R and detecting a current value ILC at the sampling timing STC corresponding to the bottom portion of the ripple R. Also in this way, the same effects as those in the above-described embodiment can be exhibited. Further, a state where the amplitude of the ripple R is large may be created by performing processing to reduce such a duty command value at the same time as the reduction of the carrier frequency fcr. In addition, when sampling for fixation failure detection processing of the reactor current IL is ended, the duty command value d is returned to the original value in step S26. In this way, as shown in FIG. 8, the output voltage of the converter 20 decreases.

Further, in the above-described embodiment, the processing of detecting the fixation failure of the IL sensor 21 has been described as being performed by reducing the carrier frequency (and/or the duty command value) when the vehicle speed is greater than or equal to a predetermined value. However, the invention is not limited thereto. For example, in a case where the deterioration of noise and vibration (NV) performance can be avoided by setting the carrier frequency f2 which is reduced to be a frequency in which it is hard for noise and vibration to occur, or the like, the processing of detecting the fixation failure of the IL sensor 21 maybe executed regardless of the vehicle speed.

Figure 9:
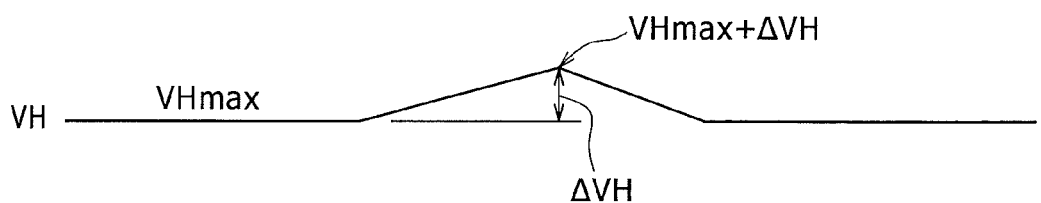
FIG. 9 is a diagram for describing the execution of processing to temporarily increase a ripple of the reactor current for abnormality detection of the current sensor when an output voltage of the converter is in a maximum boost state.

Further, as shown in FIG. 9, in the converter 20, a boost upper limit VHmax is set in consideration of the pressure resistance performance or the like of a switching element. However, even in a state where the output voltage VH of the converter 20 has reached the boost upper limit VHmax, the processing of detecting the fixation failure of the IL sensor 21 may be executed after the ripple of the reactor current IL is temporarily increased by a reduction of the carrier frequency, or the like. This is because, usually, the boost upper limit VHmax (for example, 600 volts) is set with a margin, and therefore, even if the boost voltage VH temporarily exceeds the design value by ΔVH (for example, 20 volts), a switching element never fails. In this manner, by executing the detection of the fixation failure of the IL sensor even in a state where the output voltage of the converter 20 has reached the boost upper limit, it becomes possible to appropriately detect the fixation failure of the IL sensor.

In addition, in the above-described embodiment, first, as step S10, the processing of detecting the fixation failure of the IL sensor 21 has been described as being executed when the vehicle speed is greater than or equal to a predetermined value. However, prior to this, the maximum current fluctuation range ΔILmax of the ripple R of the reactor current IL is estimated by calculation, whether the estimated value is greater than the current fluctuation range ΔILth at the time of the fixation failure of the IL sensor is determined, and it may be the case that the processing of step S10 or later is executed only in a case where it is determined that the estimate value is greater than the current fluctuation range ΔILth. In this case, the maximum current fluctuation range ΔILmax of the ripple (that is, the amplitude of the ripple) can be calculated based on the input voltage VL and the output voltage VH of the converter 20 and the carrier frequency f1 before sampling for fixation failure detection is performed. More specifically, referring to FIG. 5, with respect to the ripple R of the reactor current IL, the maximum current fluctuation range ΔILmax of the ripple can be calculated by multiplying the slope VL/L by the time T2 or by multiplying the slope (VL−VH)/L by the time T1. By doing so, by executing the fixation failure detection processing only in a case where the fluctuation range of the reactor current IL is estimated to exceed the current fluctuation range at the time of the sensor fixation failure, it becomes possible to more reliably detect the fixation failure of the IL sensor.

The invention claimed is:
1. A boost converter device comprising:
   a boost converter which includes a reactor and a switching element and can boost and output a voltage which is input from a battery;

a current sensor which detects a reactor current flowing through the reactor; and a control unit which controls the boost converter by using feedback control of the reactor current, wherein the control unit executes at least one of reducing a carrier frequency which is used in the control of the boost converter and reducing a duty command value which is used in the control of the boost converter, detects an amplitude of a current ripple by the current sensor when the reduction of the carrier frequency or the reduction of the duty command value is being executed, and detects the current sensor as being abnormal in a case where the amplitude of the current ripple is less than a predetermined current fluctuation range at the time of abnormality of the current sensor.

2. The boost converter device according to claim 1, wherein the reduction of the carrier frequency or the reduction of the duty command value is executed only in a period to detect the amplitude of the current ripple by the current sensor.

3. The boost converter device according to claim 1, wherein detection of abnormality of the current sensor is performed when a vehicle speed is greater than or equal to a predetermined value.

4. The boost converter device according to claim 2, wherein detection of abnormality of the current sensor is performed when a vehicle speed is greater than or equal to a predetermined value.

* * * * *